(12) United States Patent
Chen et al.

(10) Patent No.: US 10,629,519 B2
(45) Date of Patent: Apr. 21, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Tien-Szu Chen, Kaohsiung (TW); Sheng-Ming Wang, Kaohsiung (TW); I-Cheng Wang, Kaohsiung (TW); Wun-Jheng Syu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 12 days.

(21) Appl. No.: 15/364,139

(22) Filed: Nov. 29, 2016

(65) Prior Publication Data

US 2018/0151478 A1 May 31, 2018

(51) Int. Cl.
| | |
|---|---|
| H01L 23/495 | (2006.01) |
| H01L 23/492 | (2006.01) |
| H01L 21/56 | (2006.01) |
| H01L 23/31 | (2006.01) |
| H01L 23/552 | (2006.01) |
| H01L 21/48 | (2006.01) |
| H01L 23/04 | (2006.01) |
| H01L 23/00 | (2006.01) |

(52) U.S. Cl.
CPC ...... *H01L 23/4952* (2013.01); *H01L 21/4825* (2013.01); *H01L 21/4889* (2013.01); *H01L 21/561* (2013.01); *H01L 21/565* (2013.01); *H01L 23/04* (2013.01); *H01L 23/3142* (2013.01); *H01L 23/492* (2013.01); *H01L 23/49527* (2013.01); *H01L 23/552* (2013.01); *H01L 24/48* (2013.01); *H01L 21/568* (2013.01); *H01L 23/3107* (2013.01); *H01L 2224/4901* (2013.01); *H01L 2224/73265* (2013.01); *H01L 2224/94* (2013.01); *H01L 2224/97* (2013.01); *H01L 2924/15153* (2013.01)

(58) Field of Classification Search
CPC ............ H01L 23/4952; H01L 21/4825; H01L 21/565; H01L 23/04; H01L 23/28; H01L 23/498–49816; H01L 23/49551; H01L 23/49555; H01L 23/49861; H01L 23/31; H01L 23/3107; H01L 23/3121; H01L 23/31218; H01L 23/3128; H01L 23/3135; H01L 21/56; H01L 21/4832; H01L 21/561
See application file for complete search history.

(56) References Cited

U.S. PATENT DOCUMENTS

| | | | | |
|---|---|---|---|---|
| 5,006,919 A | * | 4/1991 | Disko | H01L 23/495 257/787 |
| 5,629,559 A | * | 5/1997 | Miyahara | H01L 23/057 257/666 |
| 6,181,002 B1 | * | 1/2001 | Juso | H01L 23/3128 257/686 |

(Continued)

*Primary Examiner* — Jose R Diaz
(74) *Attorney, Agent, or Firm* — Foley & Lardner LLP

(57) ABSTRACT

A semiconductor device package includes an electronic device, a conductive frame and a first molding layer. The conductive frame is disposed over and electrically connected to the electronic device, and the conductive frame includes a plurality of leads. The first molding layer covers the electronic device and a portion of the conductive frame, and is disposed between at least two adjacent ones of the leads.

22 Claims, 17 Drawing Sheets

(56) References Cited

U.S. PATENT DOCUMENTS

| | | | |
|---|---|---|---|
| 6,924,549 B2* | 8/2005 | Nose | H01L 23/3107 |
| | | | 257/668 |
| 7,385,299 B2* | 6/2008 | Chow | H01L 21/561 |
| | | | 257/686 |
| 7,884,484 B2* | 2/2011 | Yamano | H01L 23/18 |
| | | | 174/255 |
| 8,492,196 B2 | 7/2013 | Pagaila et al. | |
| 9,269,671 B2* | 2/2016 | Narita | H01L 21/561 |
| 9,412,729 B2* | 8/2016 | Chung | H01L 25/50 |
| 2007/0200250 A1* | 8/2007 | Koenigsberger | ............. |
| | | | H01L 23/49562 |
| | | | 257/778 |
| 2012/0075816 A1* | 3/2012 | Mashimo | H01L 21/565 |
| | | | 361/760 |
| 2015/0194362 A1* | 7/2015 | Otremba | H01L 23/367 |
| | | | 257/676 |
| 2015/0262972 A1* | 9/2015 | Katkar | H01L 21/561 |
| | | | 257/48 |
| 2015/0371960 A1* | 12/2015 | Yap | H01L 23/66 |
| | | | 257/659 |
| 2016/0192085 A1* | 6/2016 | Lee | B81B 7/007 |
| | | | 381/174 |
| 2016/0322326 A1* | 11/2016 | Katkar | H01L 24/49 |
| 2017/0033080 A1* | 2/2017 | Chen | H01L 25/0657 |
| 2017/0221728 A1* | 8/2017 | Ho | H01L 21/4828 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an electronic device electrically connected to a conductive frame and a method of manufacturing the same.

2. Description of the Related Art

A semiconductor device package may include an electronic device operating at a relatively high frequency, such as a radio frequency integrated circuit (RFIC), which may generate electromagnetic interference (EMI). The EMI becomes particularly problematic when a layout density increases and when the semiconductor device package becomes miniaturized. In addition, heat dissipation of a semiconductor device package is another issue of concern.

SUMMARY

In some embodiments, a semiconductor device package includes an electronic device, a conductive frame and a first molding layer. The conductive frame is disposed over and electrically connected to the electronic device, and the conductive frame includes a plurality of leads. The first molding layer covers the electronic device and a portion of the conductive frame, and is disposed between at least two adjacent ones of the leads.

In some embodiments, a semiconductor device package includes an electronic device, a conductive frame and a first molding layer. The electronic device has a first surface, a second surface opposite to the first surface, and a plurality of lateral sides. The conductive frame includes a cap portion facing the first surface of the electronic device, and a lateral portion surrounding the lateral sides of the electronic device. The lateral portion defines at least one notch, and the conductive frame is electrically connected to the electronic device. The first molding layer encapsulates the lateral sides and a portion of the second surface of the electronic device, the lateral portion of the conductive frame and a portion of the cap portion, and is filled into the at least one notch.

In some embodiments, a method of manufacturing a semiconductor device package includes providing a conductive frame including a plurality of leads; disposing an electronic device over the conductive frame, where the conductive frame covers a first surface of the electronic device and surrounds lateral sides of the electronic device, and is electrically connected to the electronic device; and forming a molding layer over the electronic device and the conductive frame, where the molding layer is formed between at least two adjacent ones of the leads.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
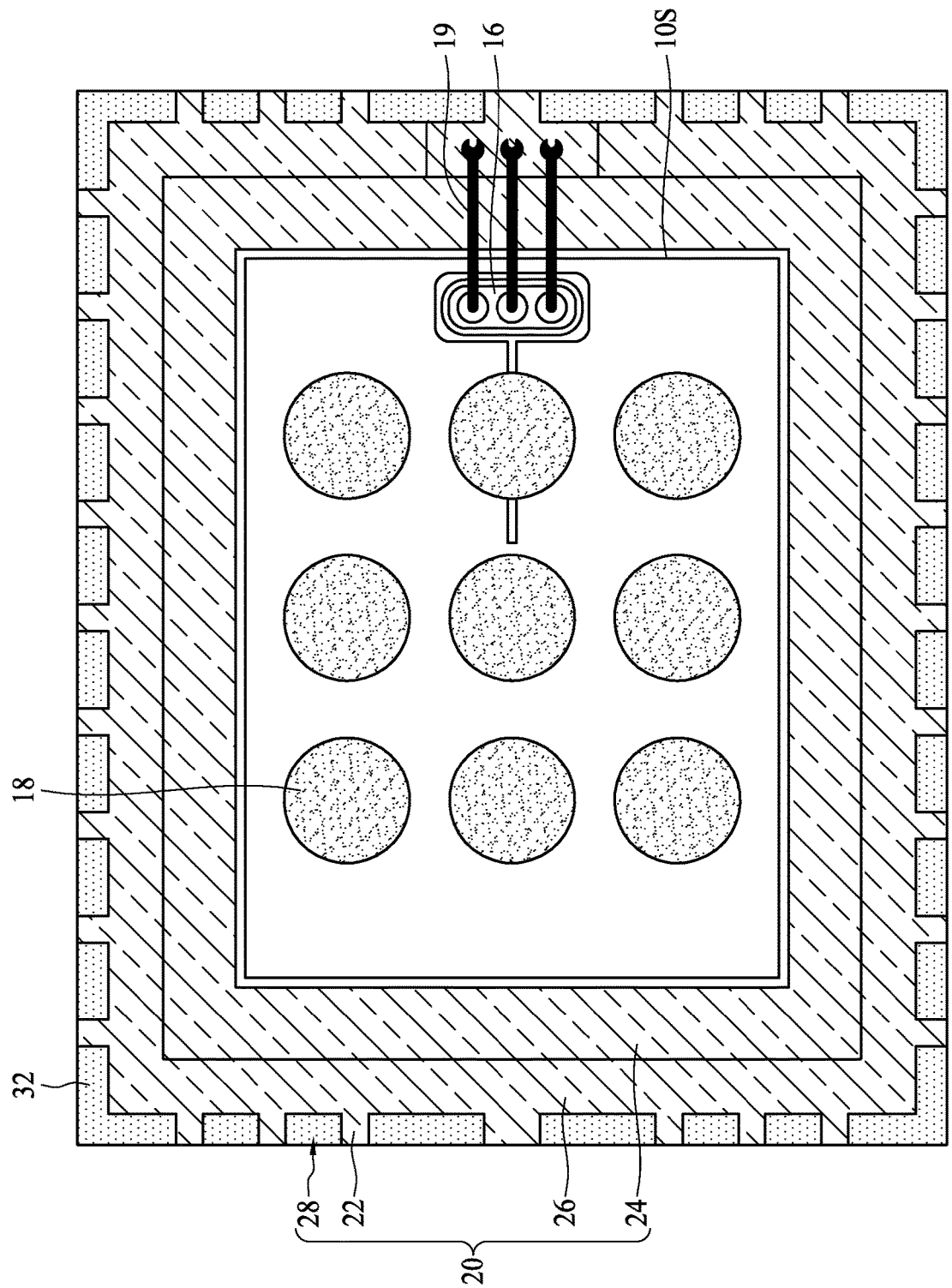
FIG. 1 is a bottom view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

The following description is directed to a semiconductor device package. In some embodiments, the semiconductor device package includes one or more electronic devices encapsulated over a conductive frame with a molding layer. The molding layer covers the electronic device, and is located between leads of the conductive frame. In some embodiments, the conductive frame is configured as a conformal shield for reducing EMI. In some embodiments, the conductive frame is configured to enhance robustness of the semiconductor device package. In some embodiments, the conductive frame is configured to improve heat dissipation ability. The following description is also directed to a method of manufacturing a semiconductor device package, as discussed below.

Figure 2:
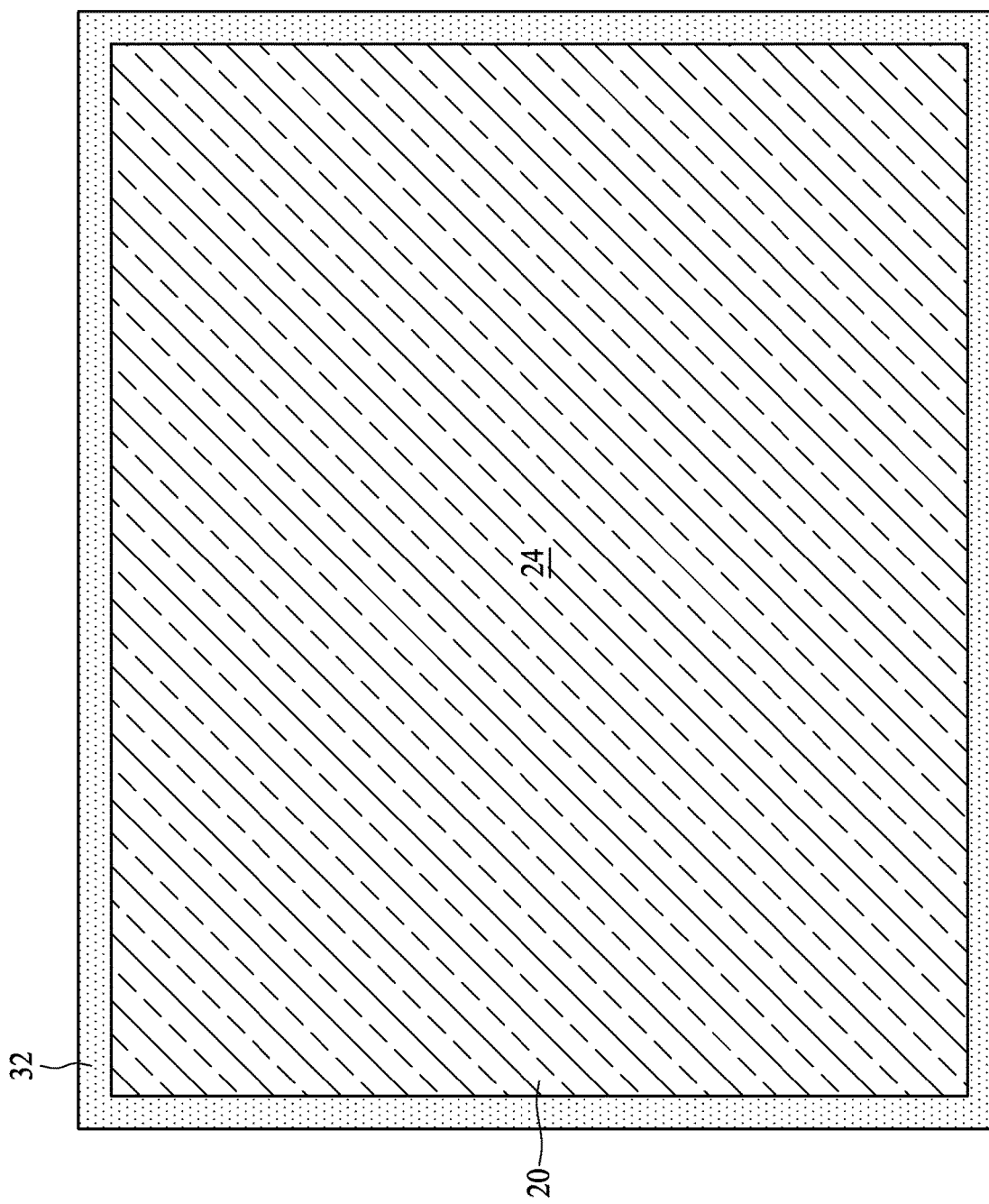
FIG. 2 is a top view of a semiconductor device package in accordance with some embodiments of the present disclosure.
Figure 3:
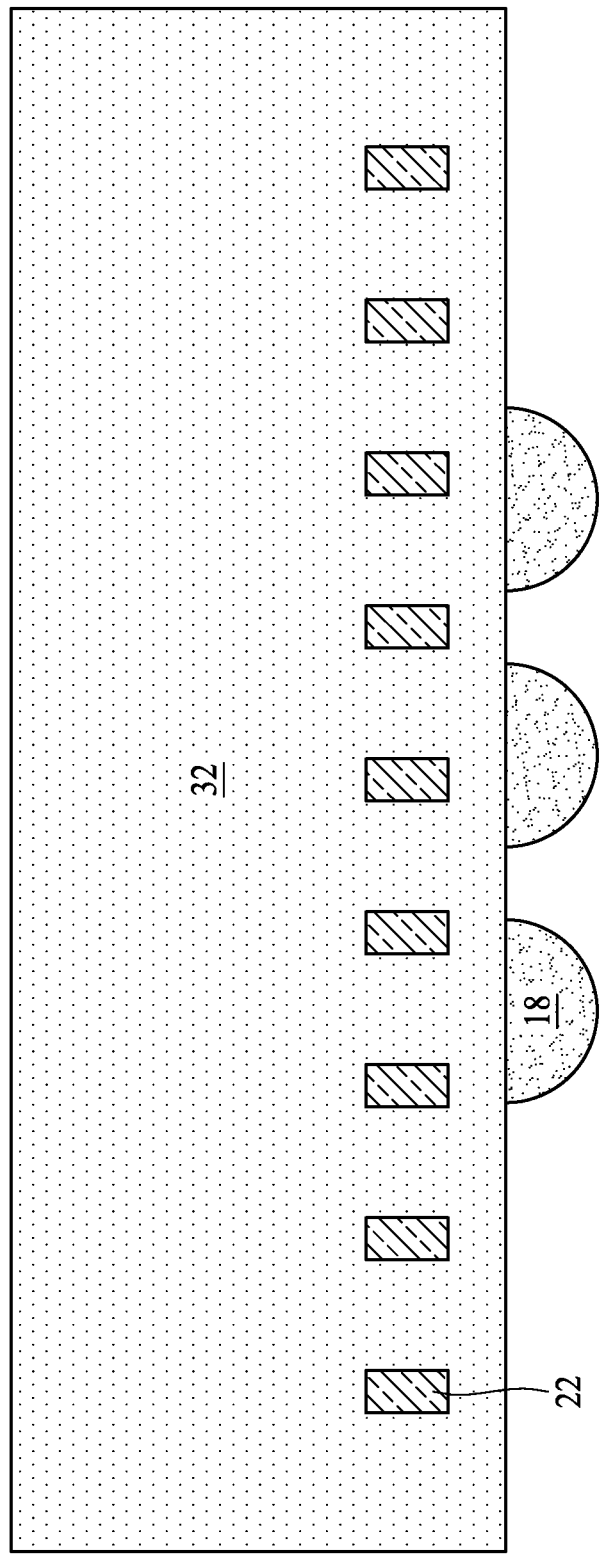
FIG. 3 is a side view of a semiconductor device package in accordance with some embodiments of the present disclosure.
Figure 4:
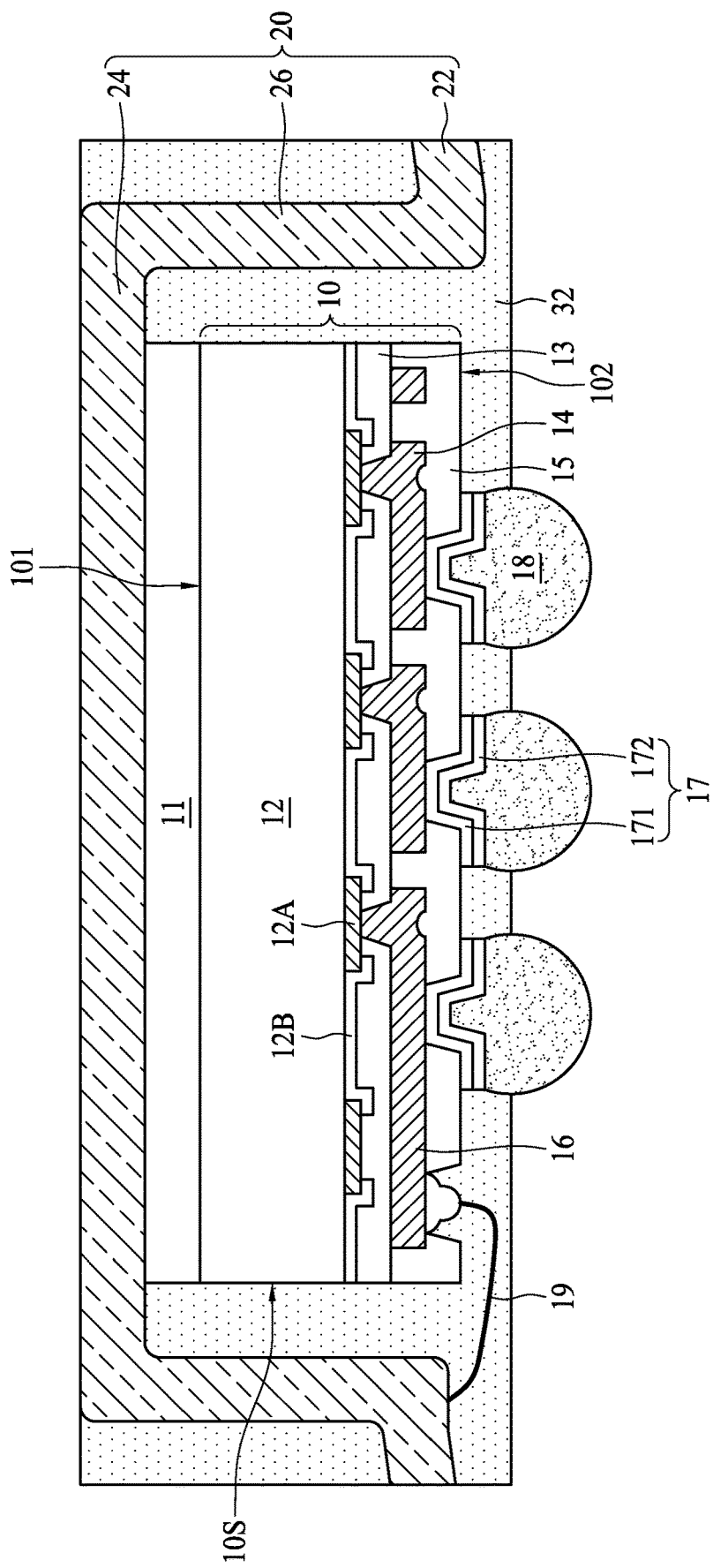
FIG. 4 is a cross-sectional view of a semiconductor device package in accordance with some embodiments of the present disclosure.

FIG. 1 is a bottom view of a semiconductor device package 1 in accordance with some embodiments of the present disclosure, FIG. 2 is a top view of the semiconductor device package 1 in accordance with some embodiments of the present disclosure, FIG. 3 is a side view of the semiconductor device package 1 in accordance with some embodiments of the present disclosure, and FIG. 4 is a cross-sectional view of the semiconductor device package 1 in accordance with some embodiments of the present disclosure. It is noted that a portion of a first molding layer 32 is not shown in the bottom view in FIG. 1 for the sake of clear illustration. As shown in FIGS. 1-4, the semiconductor device package 1 includes one or more electronic devices 10, a conductive frame 20 and a first molding layer 32. The conductive frame 20 is disposed over and electrically connected to the electronic device 10. The conductive frame 20 includes leads 22. The first molding layer 32 covers the electronic device 10 and a portion of the conductive frame 20, and the first molding layer 32 is further disposed between at least two adjacent leads 22. In some embodiments, a material of the first molding layer 32 includes, but is not limited to, a molding compound such as an epoxy resin or the like.

In some embodiments, the electronic device 10 includes an electronic component 12, and a redistribution layer (RDL) 14 over an active surface or a front surface of the electronic component 12 and electrically connected to the electronic component 12. In some embodiments, the electronic component 12 is a semiconductor die having an integrated circuit formed therein. In some embodiments, the electronic component 12 includes contact pads 12A electrically connected to the integrated circuit, and exposed from a passivation layer 12B. The RDL 14 is configured to rearrange input/output (I/O) contacts of the electronic component 12. A first insulative layer 13 is disposed over the passivation layer 12B and exposes the contact pads 12A. The RDL 14 is disposed over the first insulative layer 13 and electrically connected to the contact pads 12A exposed from the first insulative layer 13. In some embodiments, a second insulative layer 15 is disposed over the first insulative layer 13 and exposes a portion of the RDL 14.

The conductive frame (which also may be referred to as a lead frame) 20 is formed of a conductive material such as a metal or a metal alloy. By way of example, the conductive material may include, but is not limited to, copper alloy, nickel alloy or the like. The conductive frame 20 may be formed by sawing, punching, etching or other suitable processes. In some embodiments, the conductive frame 20 is formed as a monolithic structure, in which various portions are integrally formed with one another. In some embodiments, the conductive frame 20 includes a first portion 24 and a second portion 26. The first portion 24 faces a first surface (e.g., a back surface) 101 of the electronic device 10, and the first portion 24 is exposed from the first molding layer 32. The second portion 26 is connected to the first portion 24 at one end and faces lateral sides 10S of the electronic device 10, and the second portion 26 is connected to the leads 22 at the other end. In some embodiments, the first portion 24 and the second portion 26 form or define an accommodation space, where the first portion 24 is a plate structure configured as a cap portion of the conductive frame 20 capping the electronic device 10, and the second portion 26 is configured as a lateral portion surrounding the lateral sides 10S of the electronic device 10 and extending downwardly from the first portion 24. One end of each lead 22 is connected to the second portion 26 and extends outwardly from the end of the second portion 26. The leads 22 are arranged separately, and two adjacent leads 22 are spaced by a notch 28. The first molding layer 32 is filled into the notches 28 of the conductive frame 20, and thus is able to enhance structural robustness and reliability of the semiconductor device package 1. In some embodiments, one end of each lead 22 is exposed from a lateral side of the first molding layer 32, and may be substantially coplanar with the lateral side of the first molding layer 32.

In some embodiments, the first surface 101 of the electronic device 10 is bonded to the first portion (cap portion) 24 of the conductive frame 20 through an adhesive layer 11 such as a die attaching film (DAF). By way of example, the electronic component 12 is attached to the conductive frame 20 with the adhesive layer 11 including a conductive material. In some embodiments, the electronic device 10 further includes a grounding component 16. In some embodiments, the grounding component 16 is a grounding pad, which can be a portion of the RDL 14. In some embodiments, the electronic device 10 further includes one or more bonding wires 19, such as metal wires (e.g., gold or copper wires), connecting the conductive frame 20 to the grounding component 16 by wire bonding technique. By way of example, one end of each bonding wire 19 is bonded to the second portion 26 of the conductive frame 20, and another end of each bonding wire 19 is bonded to the grounding component 16. In some embodiments, the bonding wires 19 are, but not limited to, connected to one side of the second portion 26 of the conductive frame 20. The bonding wires 19 can be connected to two or more sides of the second portion 26 of the conductive frame 20. In some embodiments, the first molding layer 32 encapsulates the bonding wires 19 to protect the bonding wires 19.

In some embodiments, the semiconductor device package 1 further includes electrical contacts 18 disposed over and electrically connected to the RDL 14. The electrical contacts 18 are configured as external connectors to electrically connect the electronic device 10 and the conductive frame 20 with another electronic device such as a circuit board or another package. In some embodiments, the electrical contacts 18 are conductive bumps such as solder bumps, solder balls, solder pastes or the like. In some embodiments, the first molding layer 32 further encapsulates a portion of each of the electrical contacts 18 (e.g., an upper portion of each of the electrical contacts 18 in the orientation depicted in FIG. 4) to protect the electrical contacts 18. In some embodiments, an under bump metallurgy (UBM) 17 is disposed under each respective electrical contact 18. In some embodiments, the UBM 17 includes an adhesion layer 171 for enhancing adhesion between the electrical contact 18 and the RDL 14, and a wetting layer 172 over the adhesion layer 171 for controlling a shape of the electrical contact 18. In some embodiments, the first molding layer 32 defines openings within which respective ones of the UBMs 17 are disposed, and within which portions of the electrical contacts 18 are disposed.

In some embodiments, the conductive frame 20 is electrically connected to one or more electrical contacts 18 through the bonding wires 19 and the grounding component 16, and the one or more electrical contacts 18 can be further electrically connected to a grounding circuit of a circuit board. In some embodiments, the grounding component 16 and the one or more electrical contacts 18 also can provide a grounding path for the electronic component 12. The electronic device 10 can be electrically connected to the circuit board through the RDL 14 and another subset of the electrical contacts 18.

The semiconductor device package 1 is compatible with wafer level chip scale package (WLCSP). The conductive frame 20 surrounds the lateral sides 10S of the electronic device 10, and thus can provide sidewall protection for the semiconductor device package 1. In addition, the conductive frame 20 that encloses the lateral sides 10S and the first surface (e.g., the back surface) 101 of the electronic device 10 can be configured as a conformal shield for reducing EMI. Moreover, the semiconductor device package 1 can be electrically connected to another electronic device or semiconductor device package through the electrical contacts 18 to form a system in package (SIP) or a stacked package. Furthermore, the conductive frame 20 formed from a metal, a metal alloy or another conductive material with sufficient thermal conductivity can also be configured as a heat sink to provide a heat dissipation path for the electronic device 10.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate an example of a manufacturing method of the semiconductor device package 1 in accordance with some embodiments of the present disclosure.

Figure 5A:
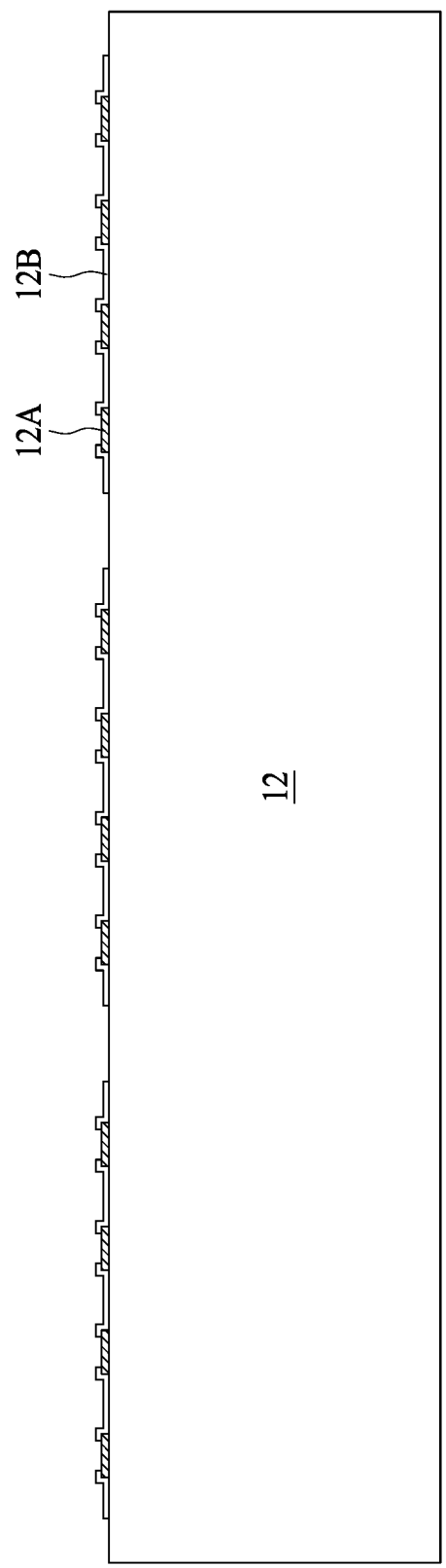
FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate an example of a manufacturing method of a semiconductor device package in accordance with some embodiments of the present disclosure.

As depicted in FIG. 5A, electronic components 12 are provided. In some embodiments, the electronic components 12 include semiconductor components formed in the form of integrated circuits in a substrate such as a wafer. In some embodiments, each electronic component 12 includes contact pads 12A electrically connected to an integrated circuit, and exposed from a passivation layer 12B.

Figure 5B:
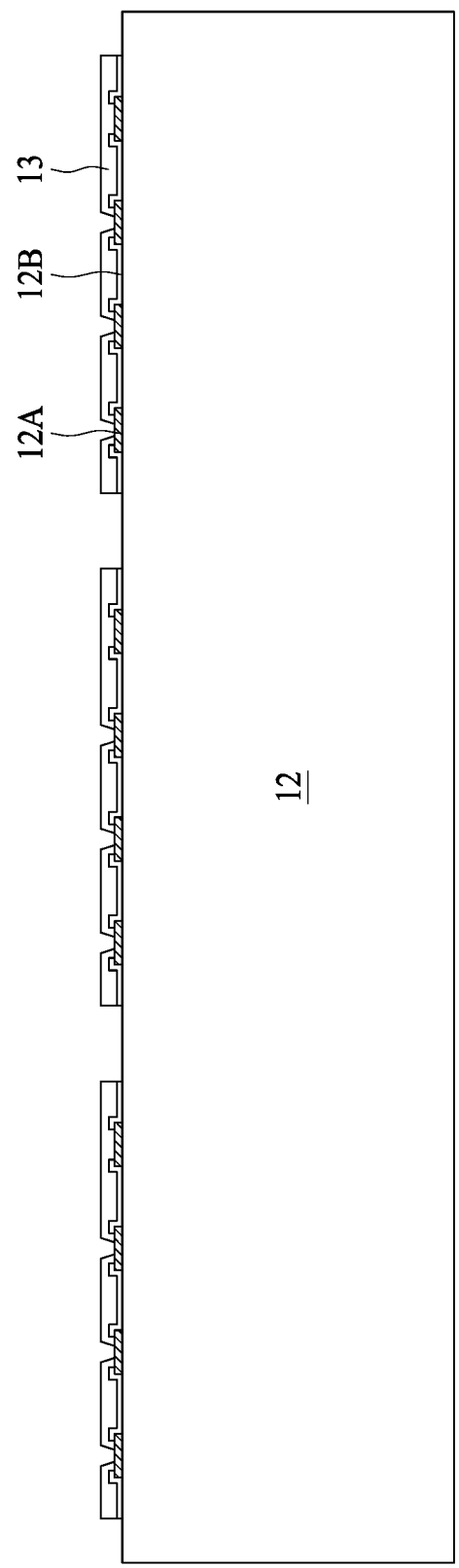

As depicted in FIG. 5B, a first insulative layer 13 is formed over the passivation layer 12B. The first insulative layer 13 is patterned to expose the contact pads 12A. In some embodiments, a material of the first insulative layer 13 includes an organic material such as polyimide (PI) or polybenzoxazole (PBO), which can be photosensitive and patterned by photolithography. The material of the first insulative layer 13 can be another organic or inorganic insulative material.

Figure 5C:
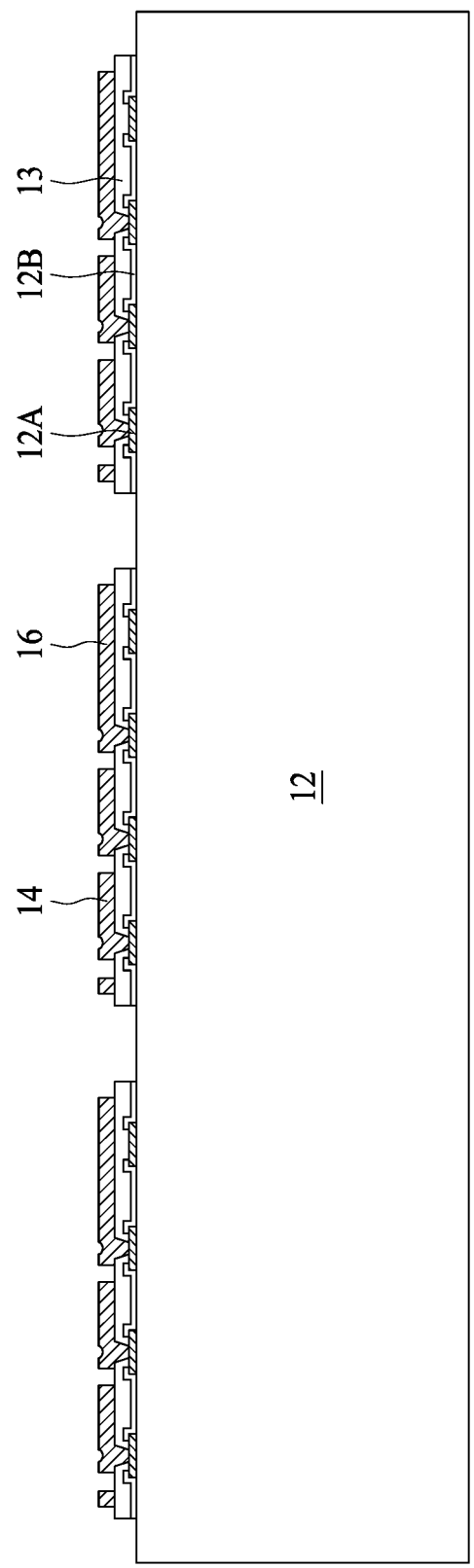

As depicted in FIG. 5C, a redistribution layer (RDL) 14 is formed over the first insulative layer 13 and is electrically connected to the contact pads 12A exposed from the first insulative layer 13. In some embodiments, a material of the RDL 14 includes a metal such as copper or copper alloy, or another suitable conductive material. In some embodiments, the RDL 14 can be formed by electroplating, physical vapor deposition (PVD), chemical vapor deposition (CVD) or other suitable process. In some embodiments, grounding components 16 are formed along with the RDL 14.

Figure 5D:
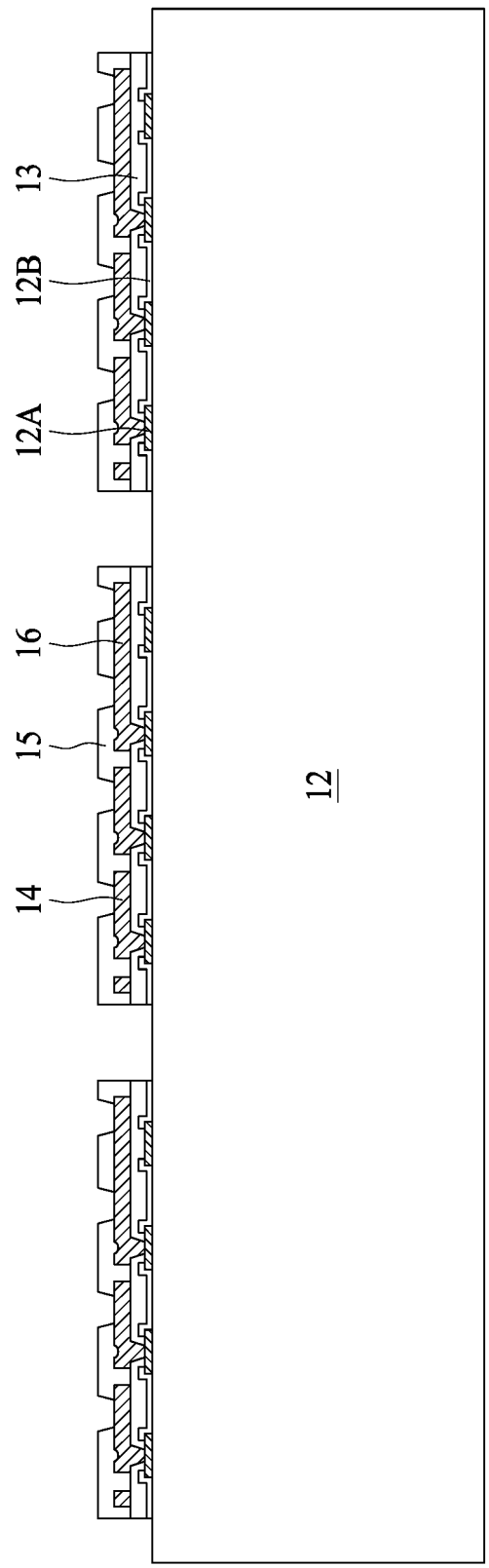

As depicted in FIG. 5D, a second insulative layer 15 is formed over the first insulative layer 13, the RDL 14 and the grounding components 16. The second insulative layer 15 exposes a portion of the RDL 14 and the grounding components 16. In some embodiments, a material of the second insulative layer 15 includes an organic material such as PI or PBO, which can be photosensitive and patterned by photolithography. The material of the second insulative layer 15 can be another organic or inorganic insulative material. The material of the second insulative layer 15 may be the same as or different from the material of the first insulative layer 13.

Figure 5E:
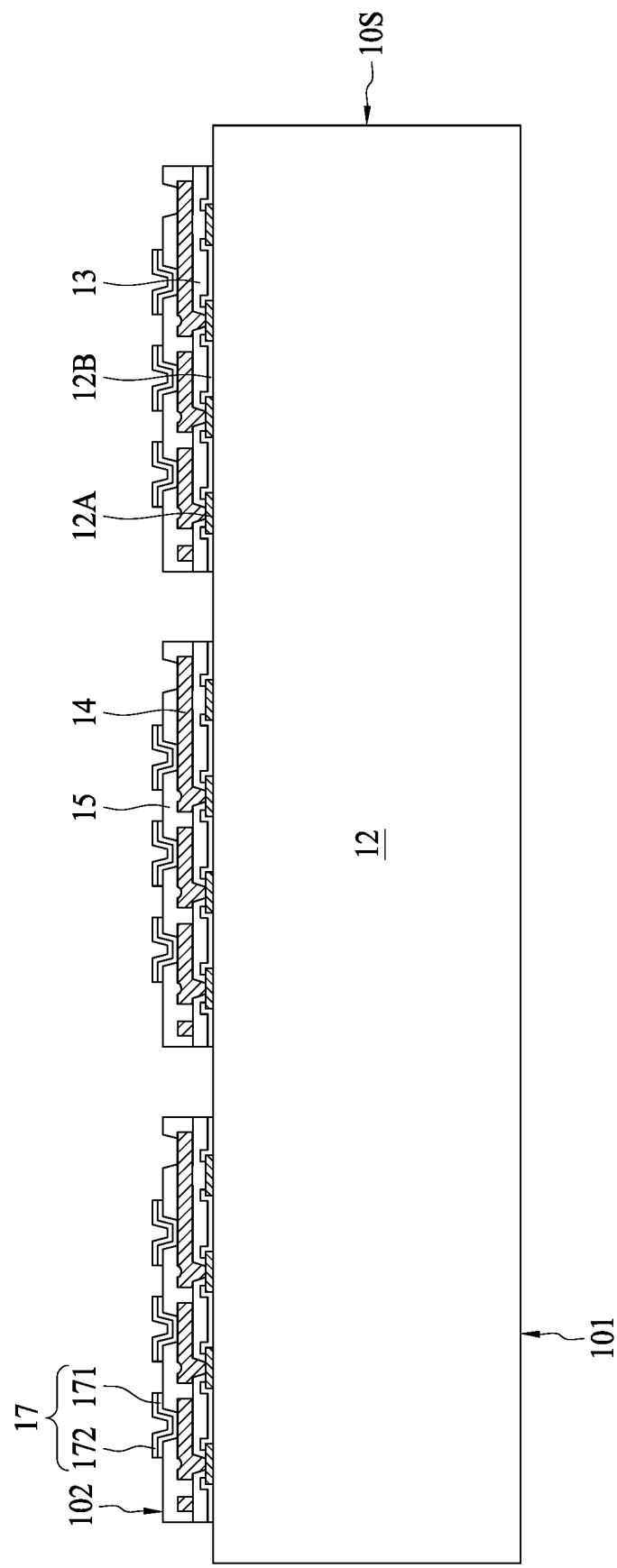

As depicted in FIG. 5E, UBMs 17 are formed so as to be disposed over the exposed portion of the RDL 14 and the grounding components 16. In some embodiments, formation of each UBM 17 includes forming an adhesion layer 171 over the RDL 14 and the grounding components 16, and forming a wetting layer 172 over the adhesion layer 171. In some embodiments, a material of the adhesion layer 171 includes, but is not limited to, titanium, chromium, titanium nitride or the like, and a material of the wetting layer 172 includes, but is not limited to, copper, nickel or the like.

Figure 5F:
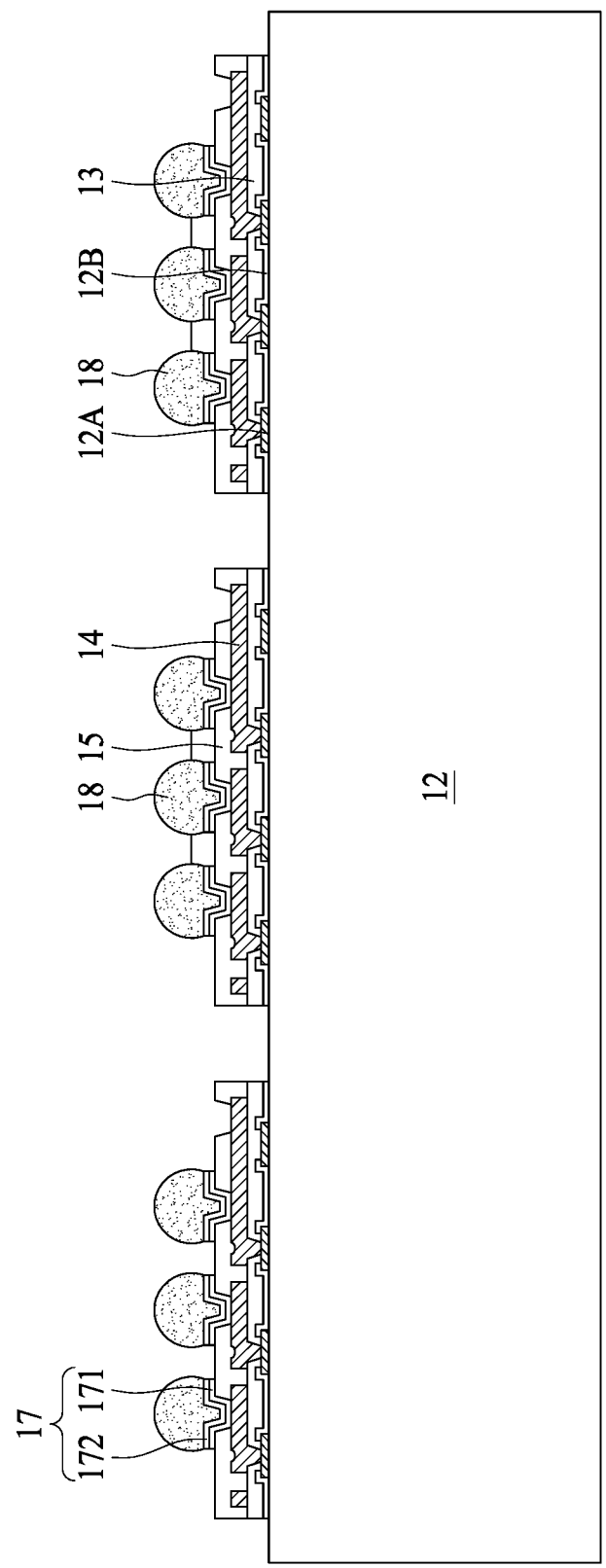

As depicted in FIG. 5F, electrical contacts 18 are formed over and electrically connected to the RDL 14 and the grounding components 16 through the UBMs 17. In some embodiments, the electrical contacts 18 include, but are not limited to, conductive bumps such as solder bumps, solder balls, solder paste or the like. In some embodiments, a material of the electrical contacts 18 includes, but is not limited to, tin (Sn), gold (Au) or the like. In some embodiments, a reflow process is performed on the electrical contacts 18.

Figure 5G:
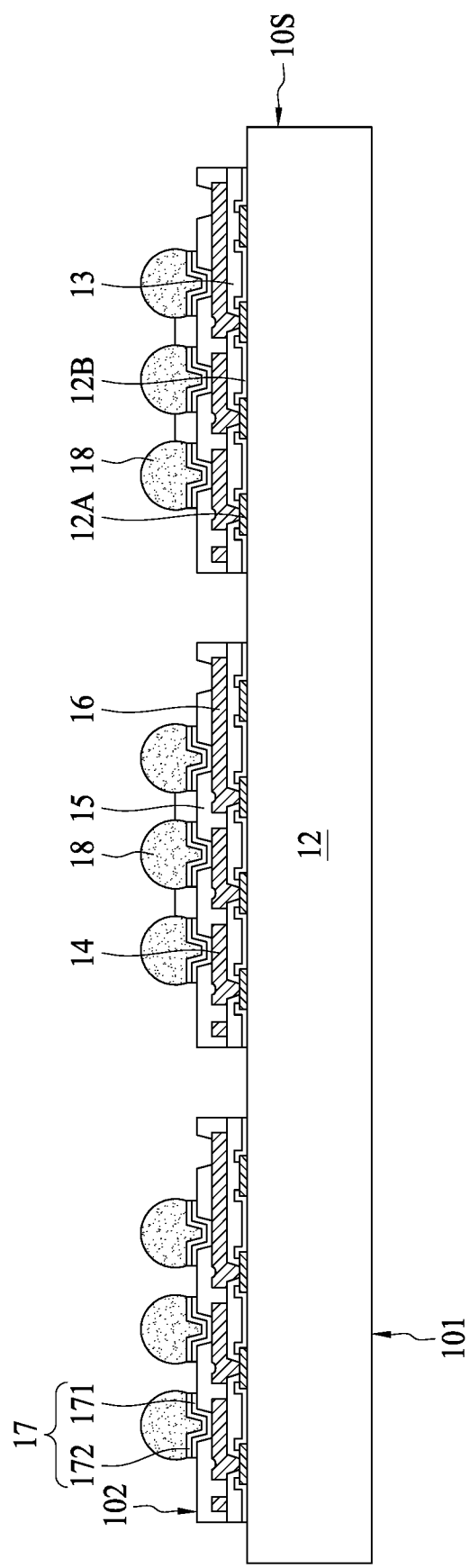
Figure 5H:
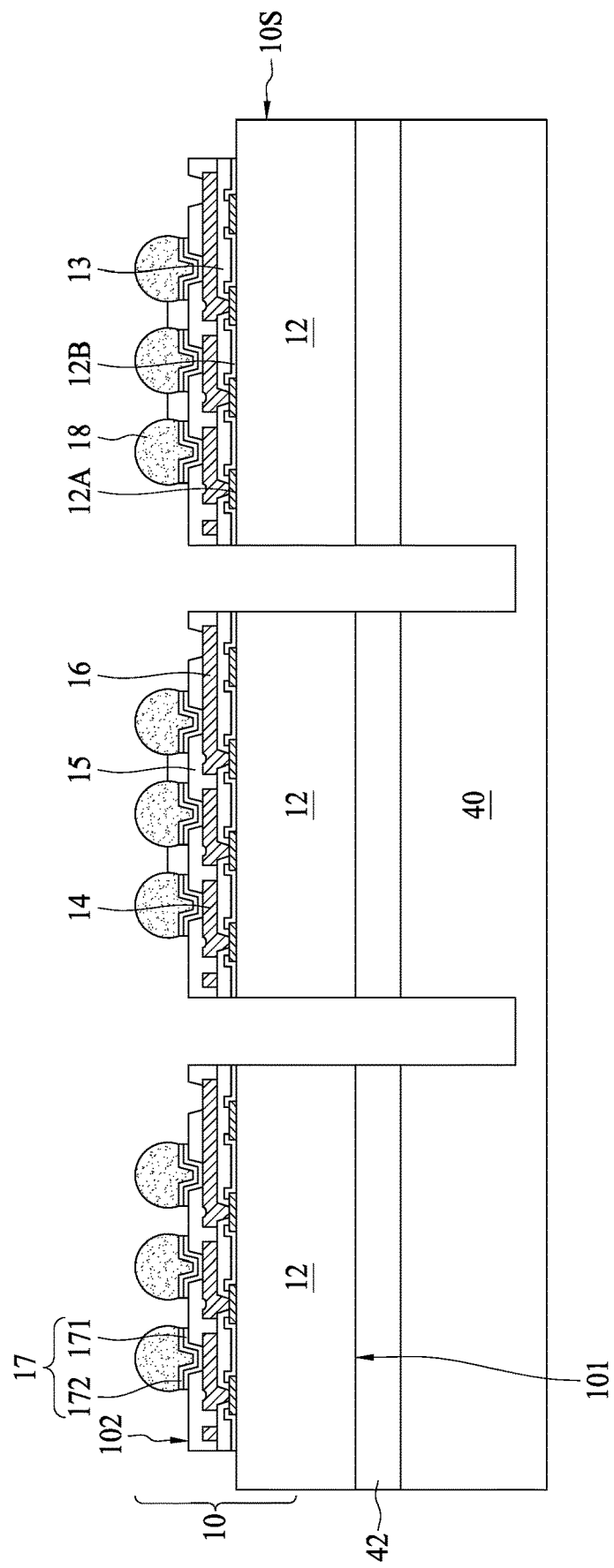

As depicted in FIG. 5G, the electronic components 12 are thinned by, for example grinding, from a first surface (e.g., a back surface) 101. As depicted in FIG. 5H, the first surface 101 is attached to a temporary carrier 40 such as a glass carrier with an adhesive layer 42 such as an adhesive tape. In some embodiments, the electronic components 12 are sawed from a second surface (e.g., a front surface) 102 to form several separate electronic devices 10.

Figure 5I:
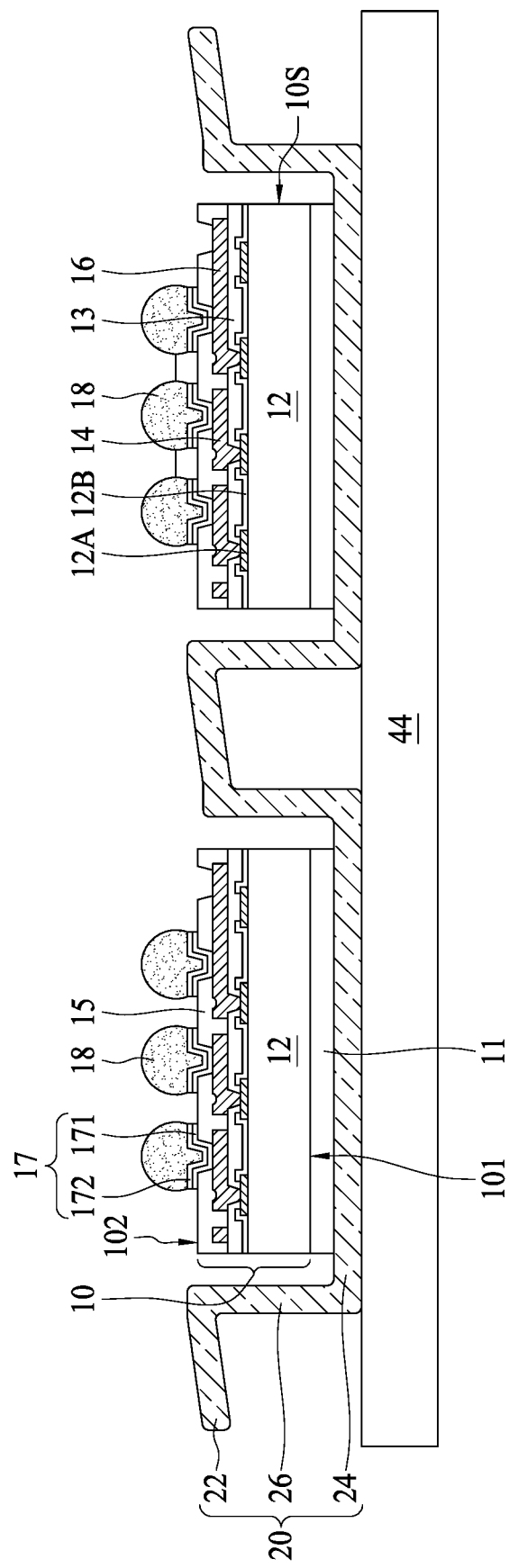

As depicted in FIG. 5I, several conductive frames 20 connected to one another are provided. In some embodiments, the conductive frames 20 are mounted on a temporary supporter 44. In some embodiments, each of the conductive frames 20 includes a first portion (a cap portion) 24, a second portion (a lateral portion) 26 and leads 22. The second portion 26 is connected to the first portion 24 at one end and, and the second portion 26 is connected to the leads 22 at another end. In some embodiments, the first portion 24 and the second portion 26 form an accommodation space for disposing the electronic device 10. One end of each lead 22 is electrically connected to the second portion 26 and extends outwardly from the end of the second portion 26, and another end of each lead 22 is electrically connected to a respective lead 22 of an adjacent conductive frame 20. The leads 22 are arranged separately with a notch 28 (as shown in FIG. 1) formed between two adjacent leads 22. The electronic devices 10 are conveyed from the temporary carrier 40 (as shown in FIG. 5H) and bonded to respective ones of the conductive frames 20. In some embodiments, a single electronic device 10 is bonded to a respective conductive frame 20. In some embodiments, two or more electronic devices 10 can be bonded to a respective conductive frame 20. In some embodiments, the first surface 101 of the electronic device 10 is bonded to the first portion 24 of the respective conductive frame 20 with an adhesive layer 11 such as a DAF.

Figure 5J:
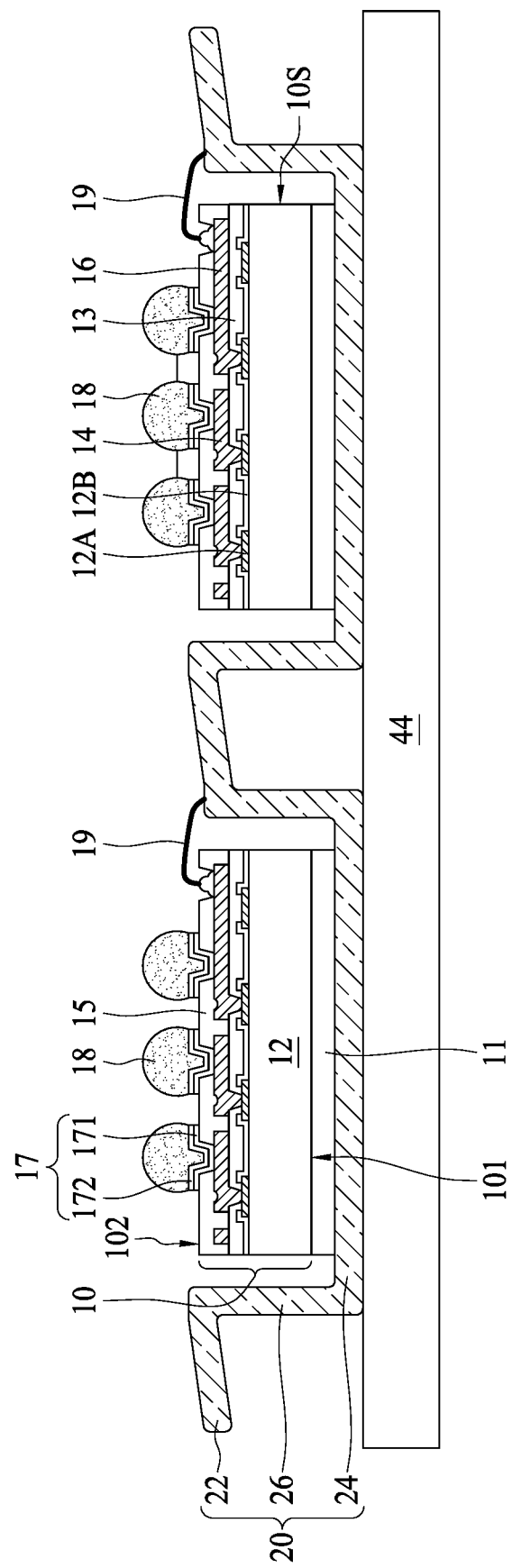

As depicted in FIG. 5J, bonding wires 19, such as gold wires, are formed over the electronic devices 10 and the conductive frames 20. In some embodiments, one end of each bonding wire 19 is bonded to a respective conductive frame 20, and another end of the bonding wire 19 is bonded to the grounding component 16 such that the grounding component 16 of the electronic device 10 is electrically connected to the conductive frame 20.

Figure 5K:
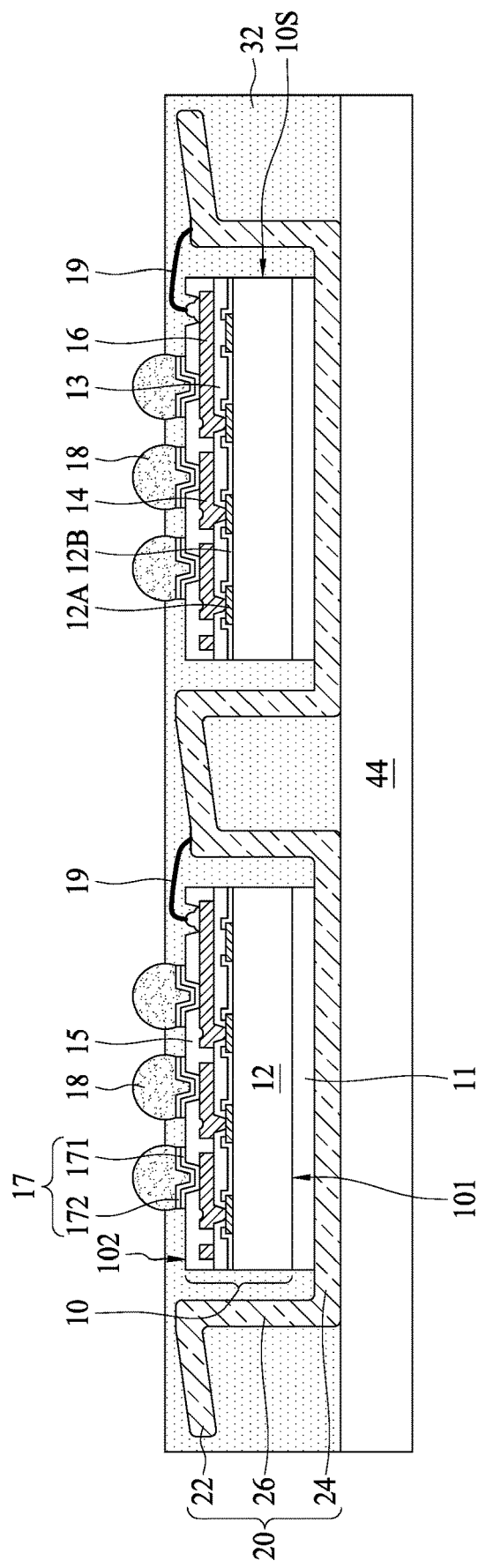

As depicted in FIG. 5K, a first molding layer 32 is formed over the electronic devices 10 and the conductive frames 20, and filled into the notches 28 (as shown in FIG. 1) between two adjacent leads 22. In some embodiments, the first molding layer 32 encapsulates the bonding wires 19 to protect the bonding wires 19. In some embodiments, the first molding layer 32 further encapsulates a portion of each of the electrical contacts 18 (e.g., a lower portion of each of the electrical contacts 18 in the orientation depicted in FIG. 5K) to protect the electrical contacts 18.

Figure 5L:
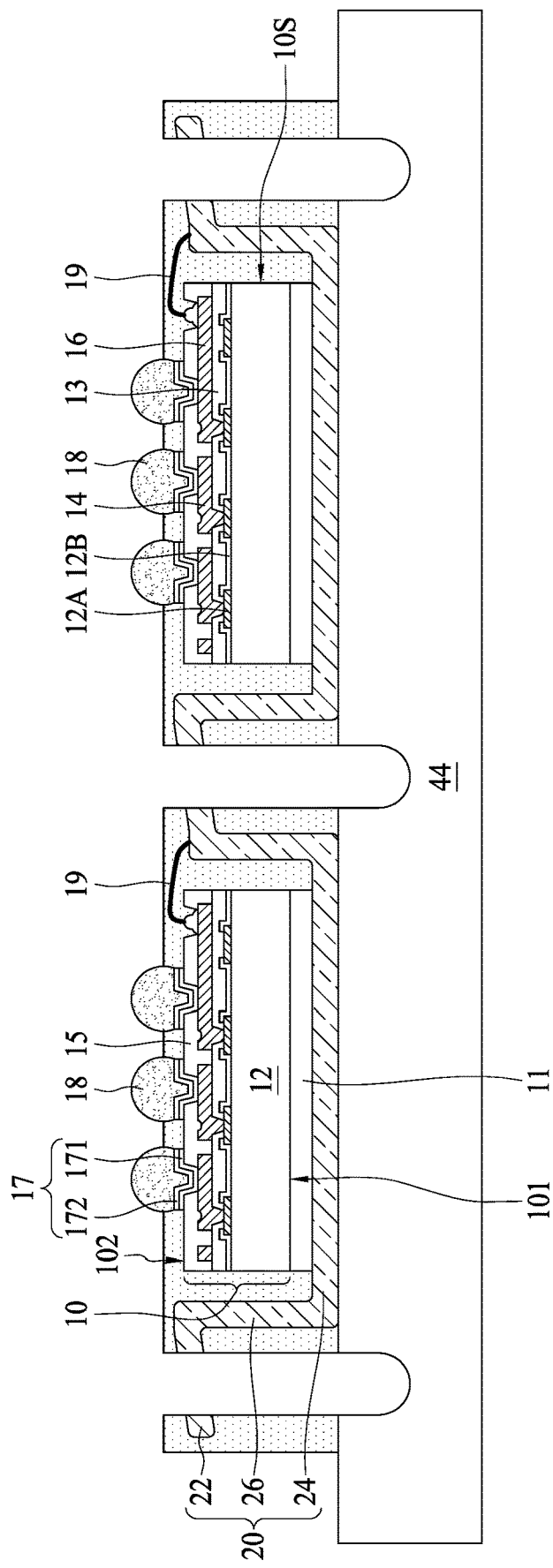

As depicted in FIG. 5L, the conductive frames 20 and the first molding layer 32 are sawed to form separate semiconductor device packages. The temporary supporter 44 is then released from the conductive frames 20 to form the semiconductive device package 1 as illustrated in FIGS. 1-4.

The semiconductor device package and manufacturing method of the present disclosure are not limited to the above-mentioned embodiments, and may be implemented according to other embodiments. To streamline the description and for the convenience of comparison between various embodiments of the present disclosure, similar components in each of the following embodiments are marked with same numerals.

Figure 6:
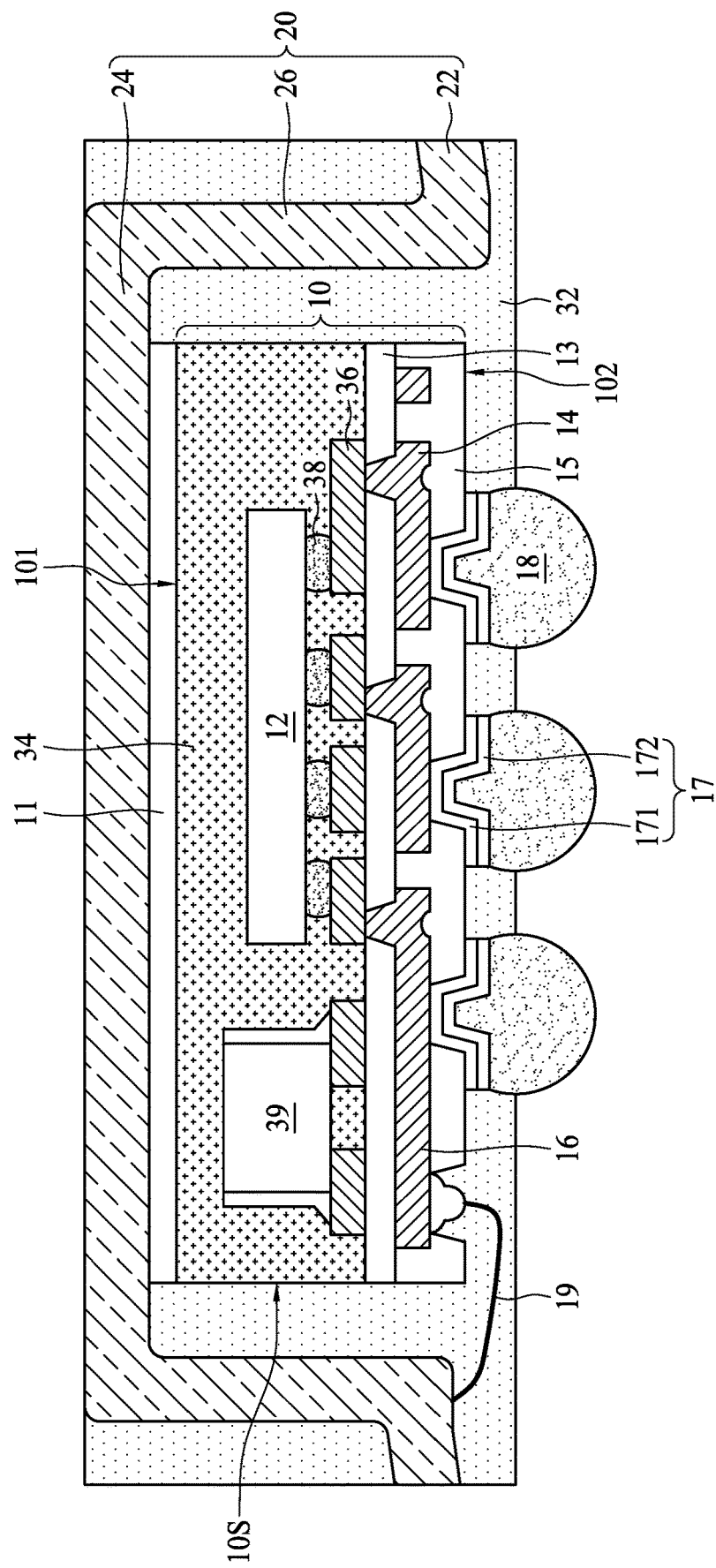
FIG. 6 is a cross-sectional view of a semiconductor device package in accordance with some embodiments of the present disclosure.

FIG. 6 is a cross-sectional view of a semiconductor device package 2 in accordance with some embodiments of the present disclosure. As shown in FIG. 6, different from the semiconductor device package 1, the electronic device 10 of the semiconductor device package 2 is a semiconductor device package which has been packaged to a certain extent. In some embodiments, the electronic device 10 includes the electronic component 12, the RDL 14 and a second molding layer 34. The RDL 14 is disposed over an active surface or a front surface of the electronic component 12 and electrically connected to the electronic component 12. The second molding layer 34 encapsulates the electronic component 12 and a portion of the RDL 14. In some embodiments, a material of the second molding layer 34 includes, but is not limited to, a molding compound such as an epoxy resin or the like. The material of the second molding layer 34 may be the same as or different from the material of the first molding layer 32. In some embodiments, the electronic device 10 further includes contact pads 36 and conductors 38 between the electronic component 12 and the RDL 14, and the RDL 14 and the electronic component 12 are electrically connected to each other through the contact pads 36 and the conductors 38. In some embodiments, the conductors 38 include conductive bumps such as solder bumps, solder balls, solder pastes or the like. In some embodiments, the electronic device 10 further includes a second electronic component 39 electrically connected to the RDL 14 and encapsulated by the second molding layer 34. In some embodiments, the second electronic component 39 includes, but is not limited to, an active component such as a memory component, or a passive component such as a capacitor, an inductor, a resistor or the like. In some embodiments, the electrical contacts 18 are disposed over and electrically connected to the RDL 14.

In some embodiments, the electronic component 12 is packaged over the RDL 14 with the second molding layer 34 to form the electronic device 10, and the second molding layer 34 that encapsulates the electronic component 12 is then attached to the first portion 24 of the conductive frame 20 through the adhesive layer 11. Then, the bonding wires 19 are formed to electrically connect the conductive frame 20 and the grounding component 16. Subsequently, the first molding layer 32 is formed to encapsulate a portion of the second molding layer 34, the RDL 14, the bonding wires 19 and the electrical contacts 18.

A semiconductor device package of various embodiments of the present disclosure is compatible with WLCSP. A conductive frame surrounding lateral sides of an electronic device is able to provide sidewall protection for the semiconductor device package. The conductive frame that encloses the lateral sides and a back surface of the electronic device can be configured as a conformal shield for reducing EMI. The semiconductor device package can be electrically connected to another electronic device or semiconductor device package through electrical contacts to form a SIP or a stacked package. The conductive frame formed from a metal, a metal alloy or another conductive material with sufficient thermal conductivity can also be configured as a heat sink to provide a heat dissipation path for the electronic device. The electronic device can be a semiconductor die, or a prepacked structure.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
an electronic device;
a conductive frame disposed on and electrically connected to the electronic device, the conductive frame comprising a plurality of leads;
a first molding layer covering the electronic device and a portion of the conductive frame, and disposed between at least two adjacent ones of the leads; and
a plurality of electrical contacts disposed over and electrically connected to the electronic device, wherein a portion of at least one of plurality of the plurality of electrical contacts protrudes from the first molding layer, and
wherein at least one end of at least one of the plurality of leads is exposed from a lateral side of the first molding layer.

2. The semiconductor device package of claim 1, wherein the conductive frame comprises a first portion and a second portion, the first portion faces a first surface of the electronic device, the second portion faces lateral sides of the electronic device, one end of the second portion is connected to the first portion and another end of the second portion is connected to the leads, the first molding layer encapsulates the second portion, the lateral sides of the electronic device, and a portion of a second surface of the electronic device opposite to the first surface of the electronic device.

3. The semiconductor device package of claim 2, wherein the first portion of the conductive frame is exposed from the first molding layer.

4. The semiconductor device package of claim 1, wherein the electronic device comprises a grounding component and a bonding wire electrically connecting the conductive frame to the grounding component.

5. The semiconductor device package of claim 4, wherein the first molding layer encapsulates the bonding wire.

6. The semiconductor device package of claim 4, wherein the electronic device further comprises an electronic component and a redistribution layer disposed over and electrically connected to the electronic component.

7. The semiconductor device package of claim 6, wherein the plurality of electrical contacts are disposed over and electrically connected to the redistribution layer, and the first molding layer encapsulates a portion of each of the electrical contacts.

8. The semiconductor device package of claim 6, wherein the electronic component is attached to the conductive frame.

9. The semiconductor device package of claim 6, wherein the electronic device further comprises a second molding layer encapsulating the electronic component, a portion of the second molding layer is encapsulated by the first molding layer, and the second molding layer is attached to the conductive frame.

10. The semiconductor device package of claim 1, wherein the at least one end of the at least one of the plurality of leads is substantially coplanar with the lateral side of the first molding layer.

11. A semiconductor device package, comprising:
an electronic device having a first surface, a second surface opposite to the first surface, and a plurality of lateral sides;
a conductive frame comprising a cap portion facing the first surface of the electronic device, and a lateral portion surrounding the lateral sides of the electronic device, the lateral portion defining at least one notch, and the conductive frame being electrically connected to the electronic device;
a first molding layer encapsulating the lateral sides and a portion of the second surface of the electronic device, the lateral portion of the conductive frame, and a portion of the cap portion, and filled into the at least one notch; and
a plurality of electrical contacts disposed over and electrically connected to the second surface of the electronic device, wherein a portion of at least one of the plurality of electrical contacts protrudes from the first molding layer,
wherein a portion of the lateral portion of the conductive frame is exposed from a lateral side of the first molding layer.

12. The semiconductor device package of claim 11, wherein one end of the lateral portion is connected to the cap portion, and the at least one notch is disposed at another end of the lateral portion.

13. The semiconductor device package of claim 11, wherein the electronic device comprises a grounding component and a bonding wire electrically connecting the conductive frame to the grounding component.

14. The semiconductor device package of claim 13, wherein the first molding layer encapsulates the bonding wire.

15. The semiconductor device package of claim 13, wherein the electronic device further comprises an electronic component and a redistribution layer disposed over the electronic component.

16. The semiconductor device package of claim 15, wherein the plurality of electrical contacts are disposed over the redistribution layer, and the first molding layer encapsulates a portion of each of the electrical contacts.

17. The semiconductor device package of claim 15, wherein the electronic component is attached to the conductive frame.

18. The semiconductor device package of claim 15, wherein the electronic device further comprises a second molding layer encapsulating the electronic component, a portion of the second molding layer is encapsulated by the first molding layer, and the second molding layer is attached to the conductive frame.

19. A semiconductor device package, comprising:
an electronic device;
a conductive frame disposed over and electrically connected to the electronic device, the conductive frame comprising a plurality of leads;
a first molding layer covering the electronic device and a portion of the conductive frame;
a grounding component electrically connected to the electronic device;
a bonding wire encapsulated by the first molding layer, wherein the conductive frame is electrically connected to the grounding component through the bonding wire; and
a plurality of electrical contacts disposed over and electrically connected to the electronic device, wherein a portion of at least one of the plurality of electrical contacts protrudes from the first molding layer.

20. The semiconductor device package of claim 19, wherein the electronic device further comprises a redistribution layer and an electronic component disposed over and electrically connected to the redistribution layer.

21. The semiconductor device package of claim 20, wherein the plurality of electrical contacts are disposed over and electrically connected to the redistribution layer, wherein the first molding layer encapsulates a portion of each of the electrical contacts.

22. The semiconductor device package of claim 20, wherein the electronic device further comprises a second molding layer encapsulating the electronic component, a portion of the second molding layer is encapsulated by the first molding layer, and the second molding layer is attached to the conductive frame.

* * * * *